United States Patent
Chi et al.

(10) Patent No.: US 10,826,457 B2
(45) Date of Patent: Nov. 3, 2020

(54) BROADBAND POWER AMPLIFIER AND MATCHING NETWORK FOR MULTI-BAND MILLIMETER-WAVE 5G COMMUNICATION

(71) Applicant: SWIFTLINK TECHNOLOGIES INC., Richmond (CA)

(72) Inventors: Taiyun Chi, Atlanta, GA (US); Hua Wang, Atlanta, GA (US); Thomas Chen, Atlanta, GA (US)

(73) Assignees: SWIFTLINK TECHNOLOGIES INC., Richmond (CA); GEORGIA TECH RESEARCH CORPORATION, Atlanta, GA (US)

( * ) Notice: Subject to any disclaimer, the term of this patent is extended or adjusted under 35 U.S.C. 154(b) by 28 days.

(21) Appl. No.: 15/891,328

(22) Filed: Feb. 7, 2018

(65) Prior Publication Data
US 2019/0245507 A1 Aug. 8, 2019

(51) Int. Cl.
| | |
|---|---|
| H03H 7/38 | (2006.01) |
| H03H 7/01 | (2006.01) |
| H01F 19/04 | (2006.01) |
| H03F 3/195 | (2006.01) |
| H01F 27/28 | (2006.01) |
| H03F 3/24 | (2006.01) |
| H03F 3/45 | (2006.01) |

(52) U.S. Cl.
CPC ............ *H03H 7/38* (2013.01); *H01F 19/04* (2013.01); *H01F 27/2804* (2013.01); *H03F 3/195* (2013.01); *H03F 3/245* (2013.01); *H03F 3/45179* (2013.01); *H03H 7/1766* (2013.01); *H01F 2027/2809* (2013.01); *H01F 2027/2819* (2013.01); *H03F 2200/411* (2013.01); *H03F 2203/45731* (2013.01); *H03H 7/0161* (2013.01); *H03H 2007/386* (2013.01)

(58) Field of Classification Search
CPC ....... H03H 7/38; H03H 7/1766; H03H 7/0161
See application file for complete search history.

(56) References Cited

U.S. PATENT DOCUMENTS

| | | | | |
|---|---|---|---|---|
| 6,097,273 A | * | 8/2000 | Frye | H01F 5/003 333/25 |
| 2004/0017266 A1 | * | 1/2004 | Zhao | H03H 7/38 333/26 |
| 2005/0206471 A1 | * | 9/2005 | Khorram | H03H 7/38 333/25 |
| 2012/0182086 A1 | * | 7/2012 | Hase | H03F 1/565 333/124 |
| 2014/0240063 A1 | * | 8/2014 | Leuschner | H03F 1/223 333/24 R |
| 2017/0077873 A1 | * | 3/2017 | Qureshi | H03F 1/56 |

* cited by examiner

*Primary Examiner* — Samuel S Outten
(74) *Attorney, Agent, or Firm* — Womble Bond Dickinson (US) LLP

(57) ABSTRACT

According to one embodiment, a matching network circuit includes a first capacitor coupled, in parallel, to an input port of the matching network circuit; a broadband on-chip transformer coupled, in parallel, to the first capacitor, where the broadband on-chip transformer includes a primary winding and a secondary winding, where the secondary winding is a partial winding. The matching network circuit includes a second capacitor coupled, in series, in between the broadband on-chip transformer and an output port of the matching network circuit.

21 Claims, 9 Drawing Sheets

BROADBAND POWER AMPLIFIER AND MATCHING NETWORK FOR MULTI-BAND MILLIMETER-WAVE 5G COMMUNICATION

FIELD OF THE INVENTION

Embodiments of the present invention relate generally to wireless communication devices. More particularly, embodiments of the invention relate to a multi-band power amplifier and broadband matching networks of a communication device.

BACKGROUND 5G communication operates in a multi-band frequency range from approximately 24 GHz to 43 GHz. The multi-band frequency operation necessitates a multi-band power amplifier (PA) and matching networks in 5G wireless communication devices. A conventional multi-band PA scheme for a 5G wireless transmitter is to directly assemble several single-band PAs and several corresponding matching networks either in a single integrated circuit (IC) chip or on a multi-chip module (MCM). However, this approach often suffers from high cost due to excessive chip/module area and complexity in packaging. Furthermore, this scheme also requires multi-band duplexers and/or switching networks in the 5G wireless transmitter that lowers the transmitter output power and efficiency.

An alternative approach is to use tunable components, such as varactors or band selection switches, to achieve tunable impedance matching over a broad bandwidth. Nevertheless, on-chip tunable components present a direct trade-off between passive loss and tuning range. To cover a 24-to-43 GHz frequency bandwidth, the performance of a PA and corresponding matching network will be substantially degraded. Tunable components also suffer from reliability and nonlinearity issues due to large voltage swing at the PA output.

High-order passive network is another solution to achieve broadband matching. Conventional high-order passive networks however often require multiple inductors and therefore occupy excessive chip area.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
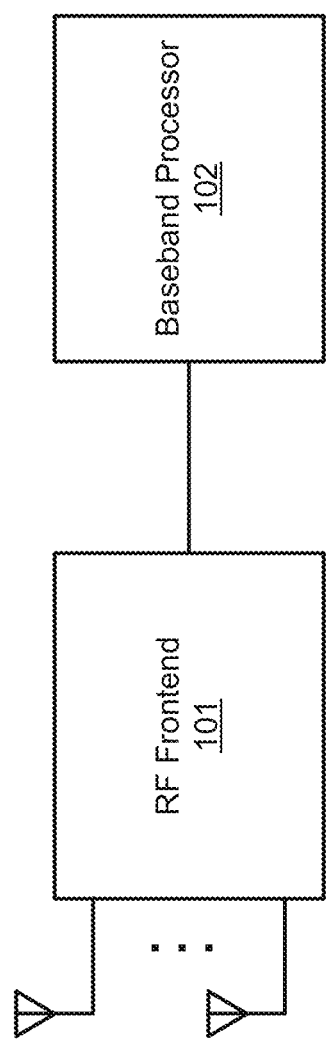
FIG. 1 is a block diagram illustrating an example of a wireless communication device according one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a matching network circuit includes a first capacitor coupled, in parallel, to an input port of the matching network circuit; a broadband on-chip transformer coupled, in parallel, to the first capacitor, where the broadband on-chip transformer includes a primary winding and a secondary winding, where the secondary winding is a partial winding. The matching network circuit includes a second capacitor coupled, in series, in between the broadband on-chip transformer and an output port of the matching network circuit.

In one aspect, the primary and the secondary windings of the broadband on-chip transformer include planar octagonal windings. In another embodiment, the planar octagonal winding of the primary winding are electromagnetically coupled to the planar octagonal winding of the secondary windings along a planar axis. In another embodiment, the primary and the secondary windings are separated by a layer of dielectric. The primary and secondary windings may be disposed on different substrate layers as a part of an integrated circuit (IC).

In one embodiment, the partial winding of the secondary winding includes approximately 1.5 turns winding. In one embodiment, the primary winding is coupled to a power supply source to supply a bias voltage to a circuit of the input port. In one embodiment, the secondary winding includes at least two conductive layers.

According to another aspect, a two-stage power amplifier (PA) includes a first amplifier stage, a second amplifier stage, a first matching network circuit coupled in between the first amplifier stage and the second amplifier stage, and a second matching network circuit coupled to an output port of the second amplifier stage. The second matching network includes a first capacitor coupled, in parallel, to an input port of the second matching network circuit; a broadband on-chip transformer coupled, in parallel, to the first capacitor, where the broadband on-chip transformer includes a primary winding and a secondary winding, where the secondary winding is a partial winding. The primary and secondary windings may be disposed on different substrate layers as a part of an integrated circuit. The second matching network includes a second capacitor coupled, in series, in between the broadband on-chip transformer and an output port of the second matching network circuit.

According to another aspect, an RF frontend integrated circuit (IC) device includes a two-stage power amplifier (PA) to amplifier a transmitted signal. The PA includes a first amplifier stage, a second amplifier stage, a first matching network circuit coupled in between the first amplifier stage and the second amplifier stage, and a second matching network circuit coupled to an output port of the second amplifier stage. The second matching network includes a first capacitor coupled, in parallel, to an input port of the second matching network circuit; a broadband on-chip transformer coupled, in parallel, to the first capacitor, where the broadband on-chip transformer includes a primary winding and a secondary winding, where the secondary winding is a partial winding. The primary and secondary windings may be disposed on different substrate layers as a part of an integrated circuit. The second matching network includes a second capacitor coupled, in series, in between the broadband on-chip transformer and an output port of the second matching network circuit.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or TOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes one or more RF transceivers, where each of the RF transceivers transmits and receives RF signals within a particular frequency band (e.g., a particular range of frequencies such as non-overlapped frequency ranges) via one of a number of RF antennas. The RF frontend IC chip further includes a frequency synthesizer coupled to the RF transceivers. The frequency synthesizer generates and provides a local oscillator (LO) signal to each of the RF transceivers to enable the RF transceiver to mix, modulate, and/or demodulate RF signals within a corresponding frequency band. The RF transceivers and the frequency synthesizer may be integrated within a single IC chip as a single RF frontend IC chip or package.

Figure 2:
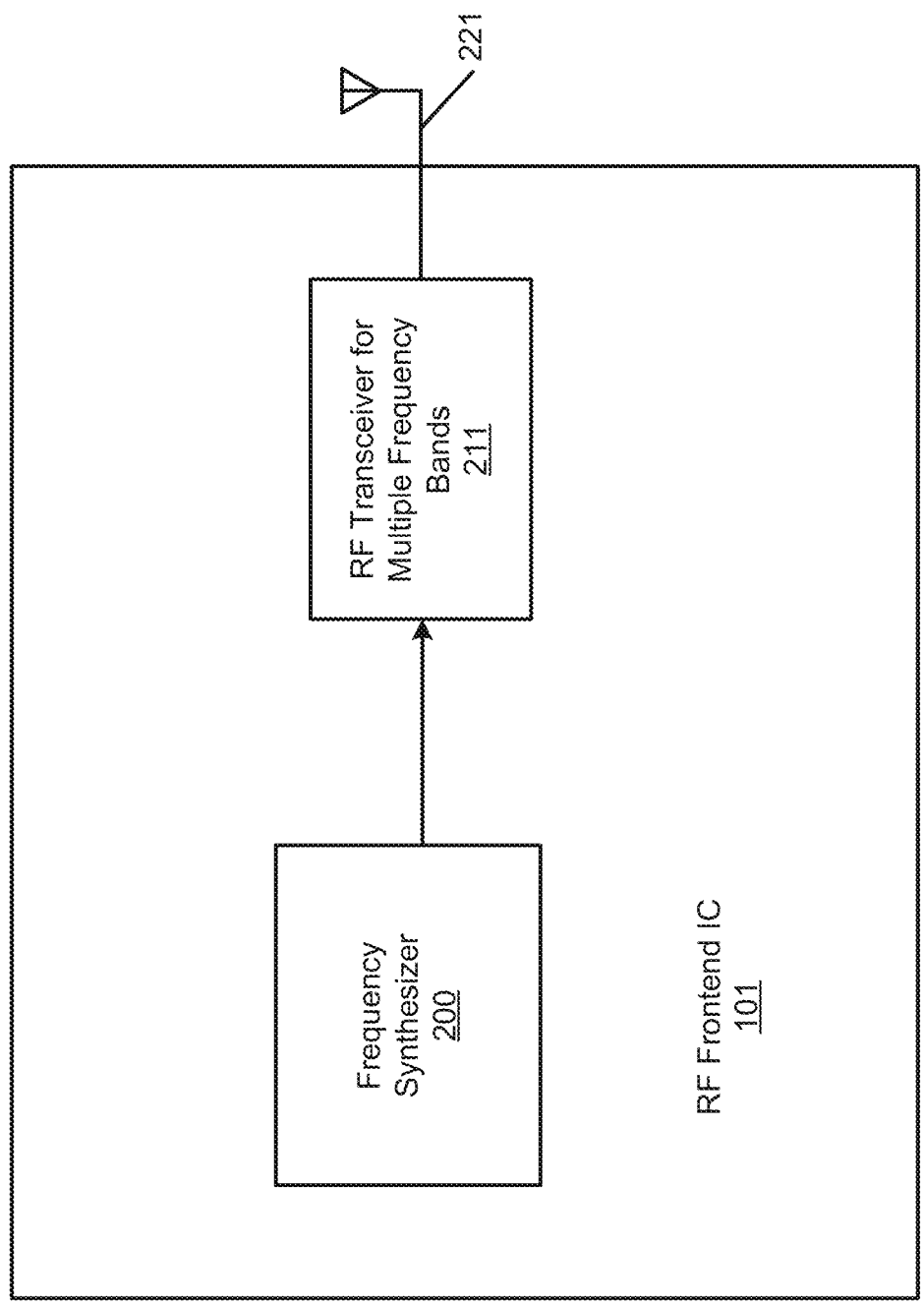
FIG. 2 is a block diagram illustrating an example of an RF frontend integrated circuit according to one embodiment.

FIG. 2 is a block diagram illustrating an example of an RF frontend integrated circuit according to one embodiment of the invention. Referring to FIG. 2, RF frontend 101 includes, amongst others, a frequency synthesizer 200 coupled to a multi-band RF transceiver 211. Transceiver 211 is configured to transmit and receive RF signals within one or more frequency bands or a broad range of RF frequencies via RF antenna 221. In one embodiment, transceiver 211 is configured to receive one or more LO signals from frequency synthesizer 200. The LO signals are generated for the one or more corresponding frequency bands. The LO signals are utilized to mix, modulate, demodulated by the transceiver for the purpose of transmitting and receiving RF signals within corresponding frequency bands. Although there is only one transceiver and antenna shown, multiple pairs of transceivers and antennas can be implemented, one for each frequency bands.

Figure 3:
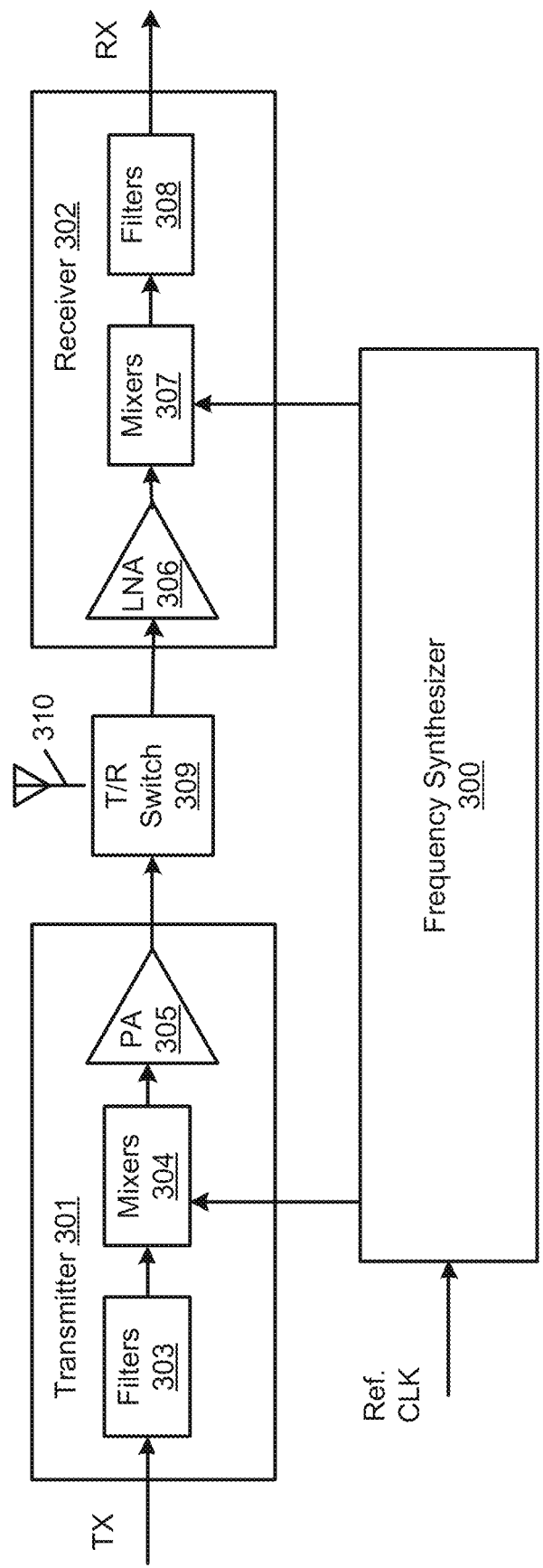
FIG. 3 is a block diagram illustrating an RF frontend integrated circuit according to one embodiment.

FIG. 3 is a block diagram illustrating an RF frontend integrated circuit according to one embodiment. Referring to FIG. 3, frequency synthesizer 300 may represent frequency synthesizer 200 as described above. In one embodiment, frequency synthesizer 300 is communicatively coupled to a broadband transmitter 301 and a broadband receiver 302, which may be a part of a transceiver such as transceiver 211. The broadband transmitter 301 transmits RF for a number of frequency bands.

In one embodiment, transmitter 301 includes filters 303, mixers 304, and a power amplifier 305. Filters 303 may be one or more low-pass (LP) filters that receives transmitting (TX) signals to be transmitted to a destination, where the TX signals may be provided from a baseband processor such as baseband processor 102. Mixers 301 (also referred to as up-convert mixers) are configured to mix and modulate the TX signals onto one or more carrier frequency signal based on local oscillator (LO) signals provided by frequency synthesizer 300. The modulated signals are then amplified by power amplifier 305 and the amplified signals are then transmitted to a remote receiver via antenna 310.

The RF frontend integrated circuit can include a receiver 302. Receiver 302 includes a low noise amplifier (LNA) 306, mixer(s) 307, and filter(s) 308. LNA 306 is to receive RF signals from a remote transmitter via antenna 310 and to amplify the received RF signals. The amplified RF signals are then demodulated by mixer(s) 307 (also referred to as a down-convert mixer) based on a LO signal provided by frequency synthesizer 300. The demodulated signals are then processed by filter(s) 308, which may be a low-pass filter. In one embodiment, transmitter 301 and receiver 302 share antenna 310 via a transmitting and receiving (T/R) switch 309. T/R switch 309 is configured to switch between transmitter 301 and receiver 302 to couple antenna 310 to either transmitter 301 or receiver 302 at a particular point in time. Although there is only one pair of transmitter and receiver shown, multiple pairs of transmitters and receivers may be coupled to frequency synthesizer 300, one for each of the multiple frequency bands.

Figure 4:
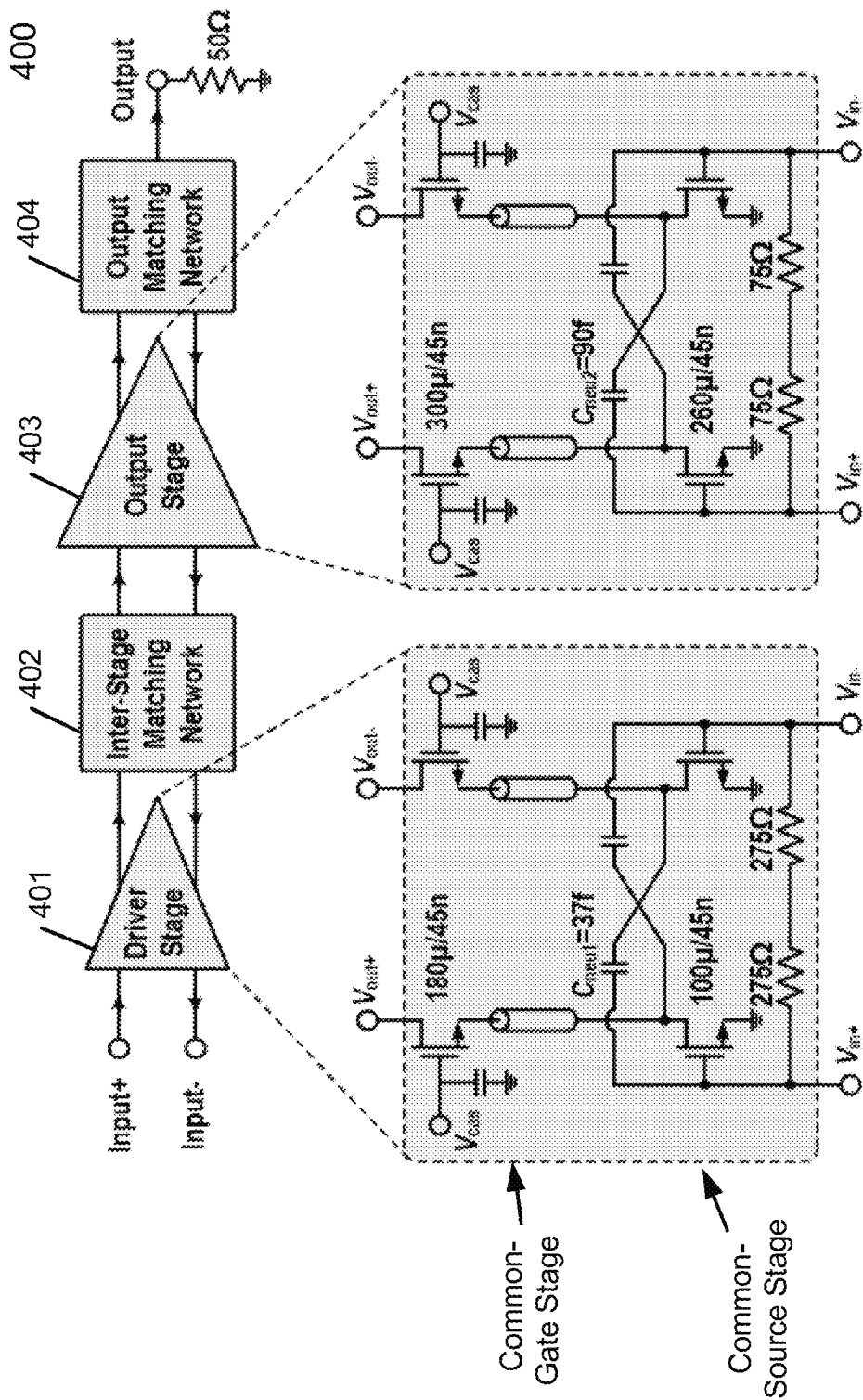
FIG. 4 is a block diagram illustrating an example of a power amplifier integrated circuit according to one embodiment.

FIG. 4 is a block diagram illustrating an example of a power amplifier (PA) integrated circuit according to one embodiment. Referring to FIG. 4, PA 400 can be PA 305 of FIG. 3. PA 400 can include driver stage 401, inter-stage matching network 402, output stage 403, and output matching network 404. Inter-stage matching network 402 and output matching network 404 can match impedances seen by driver stage 401 and output stage 403 to maximize a power transfer for PA 400. For example, inter-stage matching network 402 can match an input impedance and an output impedance to an impedance seen at the output port of driver stage 401 and an impedance seen at the input port of output stage 403, respectively, to maximize a power transfer from an input port of PA 400 to the output stage 403. Output matching network 404 can match the impedance seen from an output port of output stage 403 to maximize a power transfer from the output stage 403 to the output port of PA 400. Lastly, output matching network 404 can provide differential to single-ended conversion for a single-ended output port of PA 400.

Referring to FIG. 4, driver stage 401 and output stage 403 are amplifier stages of PA 400. In one embodiment, driver stage 401 and output stage 403 are differential cascode amplifier stages. A differential amplifier is an amplifier that amplifies a difference between two input voltages but suppresses any voltage common to the two inputs. Differential amplifiers offer common-mode noise rejection such as noise from nearby components and power supplies. A cascode amplifier is a two-stage amplifier (e.g., FETs or BJTs) that includes of a common-source (or a common-emitter for BJTs) stage feeding into a common-gate (or a common-base for BJTs) stage. Compared with single-stage amplifiers, cascode amplifiers have a higher input output isolation (i.e., reduces a leakage in reverse transmission from the output to the input ports as there is no direct coupling between the input and output ports), a higher input impedance, a higher output impedance, a higher gain, and a higher bandwidth. Here, driver stage 401 and output stage 403 include amplifiers that combine a differential topology and a cascode topology to achieve a large output swing, a wide bandwidth, with a high output power.

In one embodiment, driver stage 401 and output stage 403 can include neutral capacitors, Cneu1 and Cneu2, respectively, to neutralize any inherent gate-to-drain capacitors of the common-source FETs for the respective stage to boost a differential mode power gain and to increase stability. In one embodiment, driver stage 401 and output stage 403 can be biased in a Class B region (e.g., $V_{gs}$ equals approximately 260 mV) with approximately 2 volts of supply voltage. The 2 volts of supply voltage can be fed into the differential output ports (e.g., $V_{out+}$ and $V_{out-}$) of driver stage 401 and output stage 403, respectively. These supply voltages can be supplied by inter-stage matching network 402 and output matching network 404, respectively. In one embodiment, the size of the driver stage is approximately 2.6 times smaller than that of the output stage to ensure a high efficiency for the PA while ensuring an adequate drive.

Figure 5:
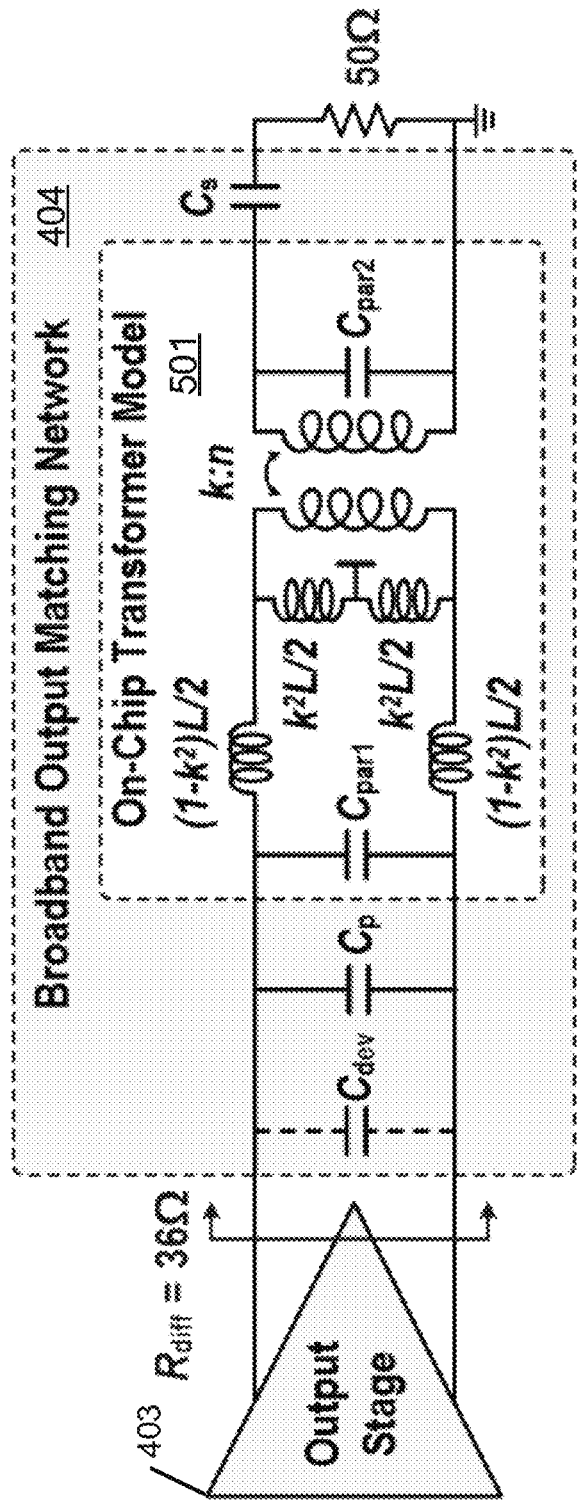
FIG. 5 is a block diagram illustrating an example of a circuit schematic of a broadband output matching network according to one embodiment.
Figure 6A:
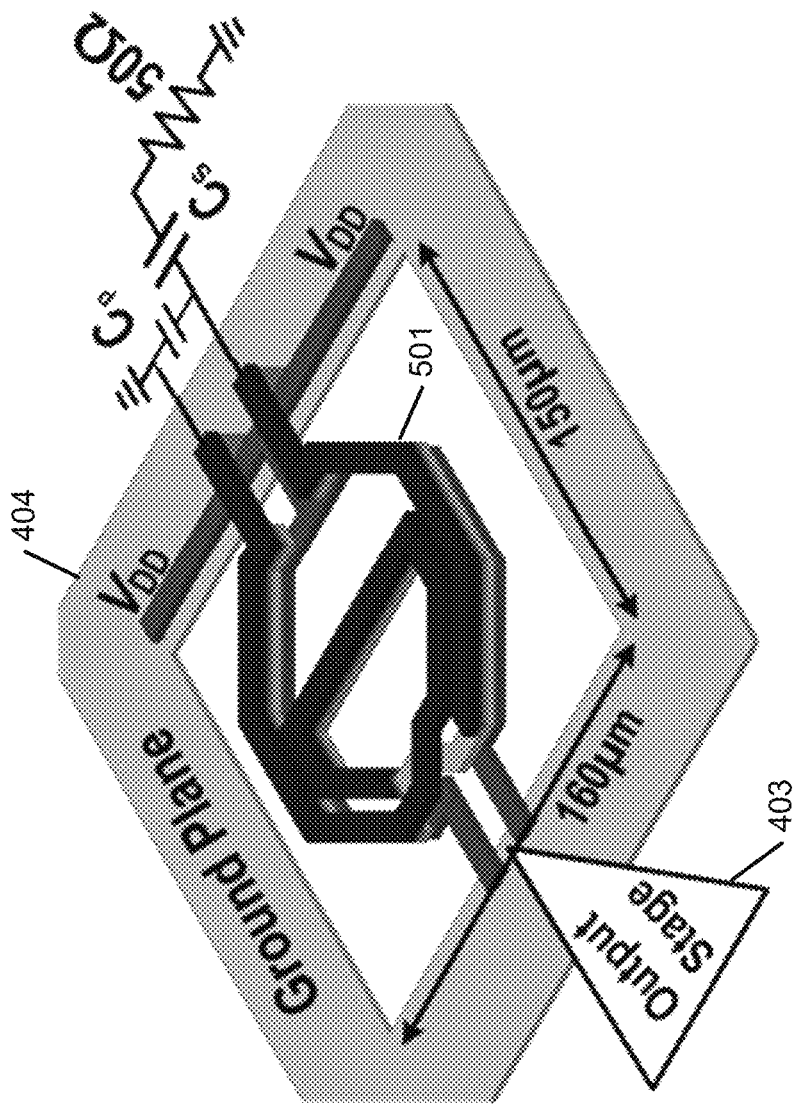
FIGS. 6A and 6B are perspective view and an exploded view of a 3D EM model of the broadband output matching network of FIG. 5.
Figure 6B:
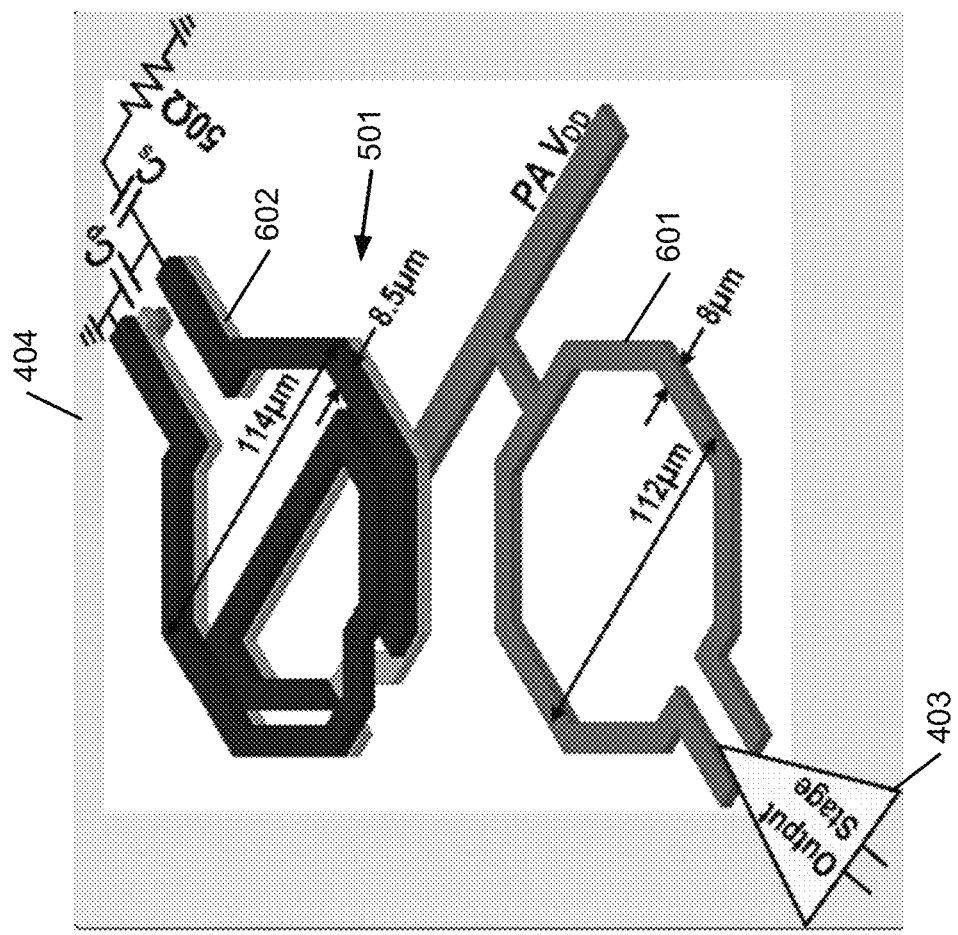

FIG. 5 is a block diagram illustrating an example of a lumped model equivalent circuit of a broadband output matching network according to one embodiment. FIGS. 6A and 6B are a perspective view and an exploded view of a 3D EM model of a broadband output matching network of FIG. 5, which is implemented as an integrated circuit. Referring to FIGS. 5, and 6A-6B, output matching network 404 includes on-chip transformer 501, parasitic capacitor $C_{dev}$ (e.g., capacitance between transformer winding plane to ground plane inherent in output matching network 404), and metal-oxide-metal (MOM) capacitors $C_p$ and $C_s$. Parasitic capacitance is an unavoidable capacitance that exists between parts a circuit because of their proximity to each other. Referring to FIG. 5, on-chip transformer 501 can be modeled by an ideal transformer with magnetizing inductors and leakage inductors, and parasitic capacitors shunt to ground ($C_{par1}$ and $C_{par2}$). Here, k is the magnetic coupling coefficient, n is the turn radio, and L is primary self-inductance. Thus, by the physical layout configuration of output matching network 404, output matching network 404 can be a broadband high-ordered passive network occupying only a single transformer footprint. Since the device parasitic capacitor $C_{dev}$ can be absorbed into output matching network 404 by tuning $C_p$, the load impedance seen by the output stage 403 should be real and almost constant over the entire bandwidth of PA 400. In one embodiment, load impedance for output stage 403 can be tuned to approximately 36Ω (differential) to generate greater than 20 dBm saturated power ($P_{sat}$) over a wide bandwidth, e.g., 24-to-43 GHz frequency range.

Referring to FIGS. 6A-6B, in one embodiment, on-chip transformer 501 includes primary winding 601 and secondary winding 602. Primary winding 601 can be coupled to a supply voltage (e.g., $V_{DD}$), such as a supply voltage of approximately 2 volts, to supply voltage to an output stage of the PA such as output stage 403 of FIG. 4. Primary winding 601 can include an octagonal shaped winding with a diameter of approximately 112 μm and a winding width of approximately 8 μm. Secondary winding 602 can be a partial winding. In one embodiment, secondary winding 602 is an octagonal shaped winding with 1.5 turns having a diameter of approximately 114 micrometers (μm) and a winding width of approximately 8.5 μm. Secondary winding 602 can be lithographically etched using two or more conductive layers to form the 1.5 turns octagonal shaped winding. Primary winding 601 and secondary winding 602 may be located at different layers of substrate, one on top of the other.

Figure 7:
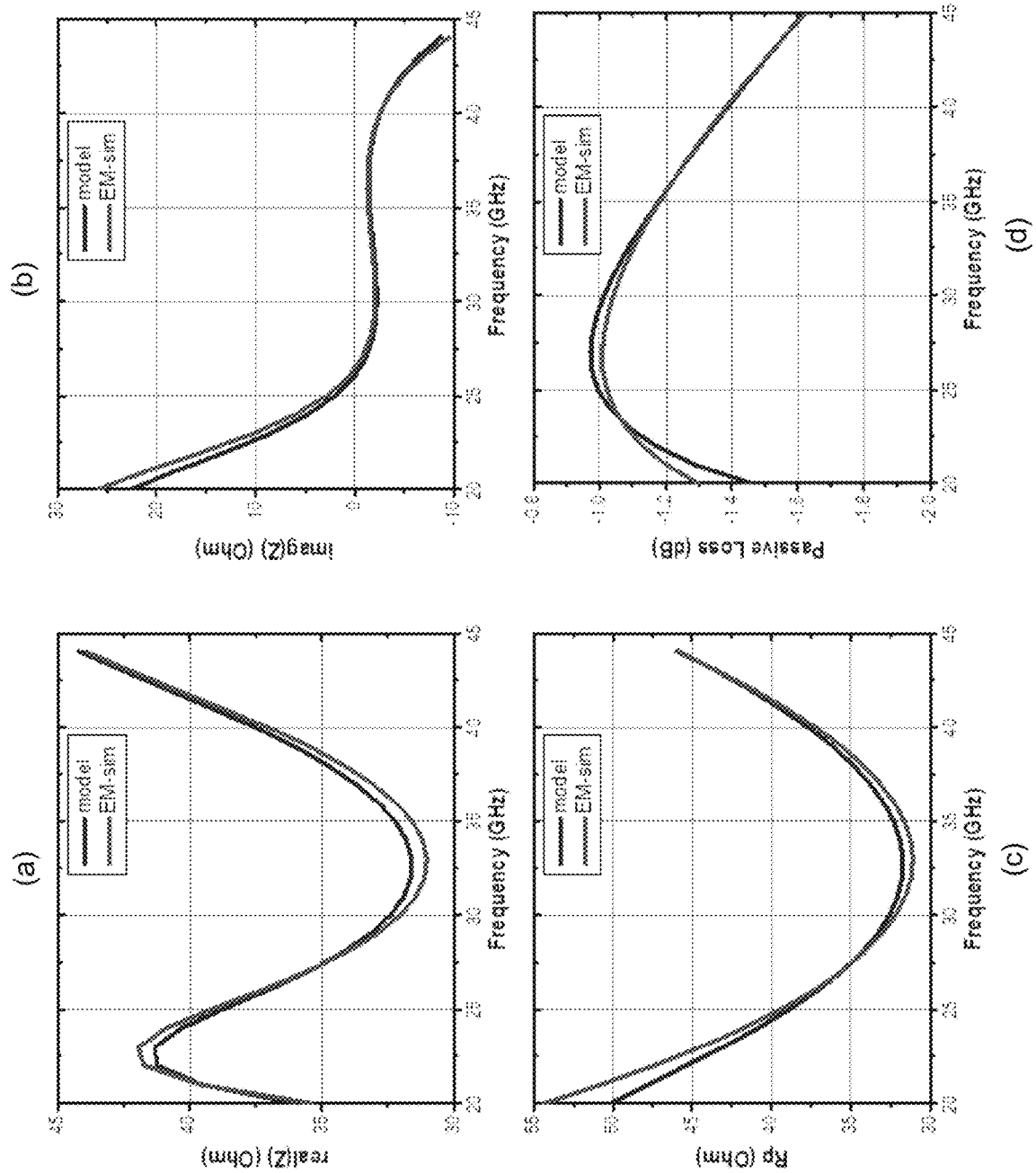
FIG. 7 illustrates example charts of simulated differential load impedance ((a) real and (b) imaginary) seen by the differential output stage and simulated (c) passive loss of the output matching network of FIGS. 6A-6B

FIG. 7 are example charts of simulated differential load impedance ((a) real and (b) imaginary) seen by the differential output stage and simulated (c) passive loss of the output matching network of FIGS. 6A-6B. Referring to FIG. 7(a-c), for the frequency range of 24-42 GHz, the real impedance of output matching network 404 varies from 31 to 42Ω centered at about 36Ω. The imaginary impedance of output matching network is approximately zero. Referring to FIG. 7(d), the passive loss for the output matching network is approximately 1-1.5 dB for a frequency range of 24-42 GHz.

Figure 8:
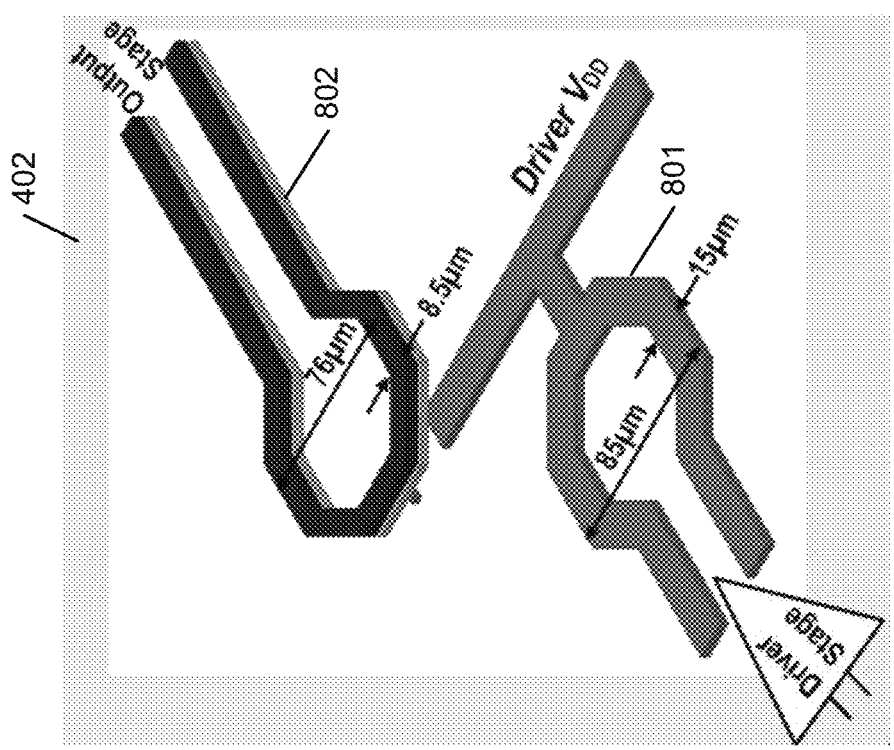
FIG. 8 is a perspective view of a 3D EM model of a broadband inter-stage matching network according to one embodiment.

Inter-stage matching network 402 of FIG. 4 can also be designed similar to output matching network 404 to achieve broadband matching. FIG. 7 is a perspective view of a 3D EM model of a broadband inter-stage matching network according to one embodiment. Inter-stage matching network 402 includes an on-chip transformer having primary winding 801 and secondary winding 802. Primary winding 801 can be coupled to a supply voltage (e.g., $V_{DD}$), such as a supply voltage of approximately 2 volts, to supply a voltage to a driver stage of the PA such as drive stage 401 of FIG. 4. Primary winding 801 can include an octagonal shaped winding with a diameter of approximately 85 μm and a winding width of approximately 15 μm. Secondary winding 802 can be an octagonal shaped winding with a diameter of approximately 76 μm and a winding width of approximately 8.5 μm. Although FIG. 8 shows a single turn, secondary winding 802 can be lithographically etched using two or more conductive layers to form a multi-turn winding.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:
1. A matching network circuit, the circuit comprising:
 a first parasitic capacitance coupled, in series, with an input port of the matching network circuit, a differential cascode amplifier stage being coupled in series with the input port of the matching network circuit, the differential cascode amplifier stage operating in a Class B region being biased with approximately two volts of a supply voltage fed into differential output ports of the differential cascode amplifier stage;

a broadband on-chip transformer coupled, in parallel, to the first parasitic capacitance, the first parasitic capacitance being external to the broadband on-chip transformer, wherein the broadband on-chip transformer includes a primary winding and a secondary winding, wherein the secondary winding is a partial winding, wherein a parasitic capacitance is coupled in parallel to the secondary winding and is enclosed in the broadband on-chip transformer, the supply voltage being supplied to the primary winding of the matching network, the broadband on-chip transformer being over a cavity of a ground plane at the supply voltage to the primary winding of the matching network, the supply voltage being supplied to an electrode over the ground plane;

a second capacitor coupled, in series, in between the broadband on-chip transformer and an output port of the matching network circuit; and a third capacitor coupled, in parallel to the first parasitic capacitance and in between the first parasitic capacitance and the broadband on-chip transformer, the third capacitor being external to the broadband on-chip transformer and being metal-oxide-metal (MOM), wherein the matching network circuit matches an impedance at an output port of an amplifier stage.

2. The matching network circuit of claim 1, wherein the primary and the secondary windings of the broadband on-chip transformer comprise planar octagonal windings.

3. The matching network circuit of claim 2, wherein the planar octagonal winding of the primary winding are electromagnetically coupled to the planar octagonal winding of the secondary windings along a planar axis.

4. The matching network circuit of claim 2, wherein the primary and the secondary windings are separated by a layer of dielectric.

5. The matching network circuit of claim 1, wherein the partial winding of the secondary winding includes a 1.5 turns winding.

6. The matching network circuit of claim 1, wherein the primary winding is coupled to a supply source to supply a bias voltage to a circuit of the input port.

7. The matching network circuit of claim 1, wherein the secondary winding includes at least two conductive layers.

8. A two-stage power amplifier (PA), the PA comprising:
a first amplifier stage;
a second amplifier stage;
a first matching network circuit coupled in between the first amplifier stage and the second amplifier stage; and
a second matching network circuit coupled to an output port of the second amplifier stage, wherein the second matching network circuit comprises:
a first parasitic capacitance coupled, in series, with an input port of the second matching network circuit, the second amplifier stage including a differential cascode amplifier stage being coupled in series with the input port of the second matching network circuit, the differential cascode amplifier stage operating in a Class B region being biased with approximately two volts of a supply voltage fed into differential output ports of the differential cascode amplifier stage;
a broadband on-chip transformer coupled, in parallel, to the first parasitic capacitance, the first parasitic capacitance being external to the broadband on-chip transformer, wherein the broadband on-chip transformer includes a primary winding and a secondary winding, wherein the secondary winding is a partial winding, wherein a parasitic capacitance is coupled in parallel to the secondary winding and is enclosed in the broadband on-chip transformer, the supply voltage being supplied to the primary winding of the second matching network, the broadband on-chip transformer being over a cavity of a ground plane at the supply voltage to the primary winding of the second matching network, the supply voltage being supplied to an electrode over the ground plane;
a second capacitor coupled, in series, in between the broadband on-chip transformer and an output port of the matching network circuit; and
a third capacitor coupled, in parallel to the first parasitic capacitance and in between the first parasitic capacitance and the broadband on-chip transformer, the third capacitor being external to the broadband on-chip transformer and being metal-oxide-metal (MOM), wherein the second matching network circuit matches an impedance at an output port of the first amplifier stage.

9. The PA of claim 8, wherein the primary and the secondary windings of the broadband on-chip transformer comprise planar octagonal windings.

10. The PA of claim 9, wherein the planar octagonal winding of the primary winding are electromagnetically coupled to the planar octagonal winding of the secondary windings along a planar axis.

11. The PA of claim 9, wherein the primary and the secondary windings are separated by a layer of dielectric.

12. The PA of claim 8, wherein the partial winding of the secondary winding includes a 1.5 turns winding.

13. The PA of claim 8, wherein the primary winding is coupled to a supply source to supply a bias voltage to a circuit of the input port.

14. The PA of claim 8, wherein the secondary winding includes at least two conductive layers.

15. A radio frequency (RF) frontend circuit comprising a power amplifier to amplify a transmitted signal, the power amplifier comprising:
a first amplifier stage;
a second amplifier stage;
a first matching network circuit coupled in between the first amplifier stage and the second amplifier stage; and
a second matching network circuit coupled to an output port of the second amplifier stage, wherein the second matching network circuit comprises:
a first parasitic capacitance coupled, in series, with an input port of the second matching network circuit, the second amplifier stage including a differential cascode amplifier stage being coupled in series with the input port of the second matching network circuit, the differential cascode amplifier stage operating in a Class B region being biased with approximately two volts of a supply voltage fed into differential output ports of the differential cascode amplifier stage;
a broadband on-chip transformer coupled, in parallel, to the first parasitic capacitance, the first parasitic capacitance being external to the broadband on-chip transformer, wherein the broadband on-chip transformer includes a primary winding and a secondary winding, wherein the secondary winding is a partial winding, wherein a parasitic capacitance is coupled in parallel to the secondary winding and is enclosed in the broadband on-chip transformer, the supply voltage being supplied to the primary winding of the second matching network, the broadband on-chip transformer being over a cavity of a ground plane at the supply voltage to the primary winding of the second matching network, the supply voltage being supplied to an electrode over the ground plane;

a second capacitor coupled, in series, in between the broadband on-chip transformer and an output port of the matching network circuit; and a third capacitor coupled, in parallel to the first capacitor and in between the first capacitor and the broadband on-chip transformer, the third capacitor external to the broadband on-chip transformer metal-oxide-metal (MOM), wherein the matching network circuit matches an impedance at an output port of a first amplifier stage;

a third capacitor coupled, in parallel to the first parasitic capacitance and in between the first parasitic capacitance and the broadband on-chip transformer, the third capacitor being external to the broadband on-chip transformer and being metal-oxide-metal (MOM), wherein the second matching network circuit matches the impedance at an output port of the first amplifier stage.

16. The RF front end circuit of claim 15, wherein the primary and the secondary windings of the broadband on-chip transformer comprise planar octagonal windings.

17. The RF front end circuit of claim 16, wherein the planar octagonal winding of the primary winding are electromagnetically coupled to the planar octagonal winding of the secondary windings along a planar axis.

18. The RF front end circuit of claim 16, wherein the primary and the secondary windings are separated by a layer of dielectric.

19. The RF front end circuit of claim 15, wherein the partial winding of the secondary winding includes a 1.5 turns winding.

20. The RF front end circuit of claim 15, wherein the primary winding is coupled to a supply source to supply a bias voltage to a circuit of the input port.

21. The RF front end circuit of claim 15, wherein the secondary winding includes at least two conductive layers.

* * * * *